United States Patent
Cobbley (10) Patent No.: US 6,501,157 B1
(45) Date of Patent: *Dec. 31, 2002

(54) SUBSTRATE FOR ACCEPTING WIRE BONDED OR FLIP-CHIP COMPONENTS

(75) Inventor: Chad Cobbley, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/060,740

(22) Filed: Apr. 15, 1998

(51) Int. Cl.$^7$ ................................................ H01L 23/48
(52) U.S. Cl. ...................... 257/669; 257/688; 257/666; 257/780
(58) Field of Search ................................. 257/778, 734, 257/688, 666, 669, 676, 698, 696, 673, 780; 438/107, 455

(56) References Cited

U.S. PATENT DOCUMENTS

| | | | |
|---|---|---|---|
| 4,158,850 A | * 6/1979 | Lehmann et al. | 357/38 |
| 5,216,278 A | 6/1993 | Lin et al. | 257/688 |
| 5,489,802 A | * 2/1996 | Sakamoto et al. | 257/688 |
| 5,545,923 A | 8/1996 | Barber | 257/691 |
| 5,578,874 A | 11/1996 | Kurogi et al. | |
| 5,604,383 A | * 2/1997 | Matsuzaki | 257/778 |
| 5,637,920 A | 6/1997 | Loo | 257/700 |
| 5,789,804 A | * 8/1998 | Matsuoka et al. | 257/669 |
| 5,973,403 A | 10/1999 | Wark | 257/777 |
| 6,107,678 A | * 8/2000 | Shigeta et al. | 257/669 |

* cited by examiner

Primary Examiner—Matthew Smith
Assistant Examiner—V. Yeusikov
(74) Attorney, Agent, or Firm—Workman, Nydegger & Seeley (57) ABSTRACT

A semiconductor package assembly is disclosed having a semiconductor die receiving member configured to accept a semiconductor die in either the flip-chip or the wirebond orientations. First contact sites on a die receiving surface provide electrical connection with a flip-chip component. Second contact sites provide electrical connection with a wirebond component. Electrically conductive traces connect the first and second contact sites with terminal contact sites. The semiconductor package assembly may further include the flip-chip or wirebond component mounted over the die receiving surface. Further, the assembly may also include a mounting substrate in electrical connection with the terminal contact sites.

49 Claims, 5 Drawing Sheets

SUBSTRATE FOR ACCEPTING WIRE BONDED OR FLIP-CHIP COMPONENTS

BACKGROUND OF THE INVENTION

1. The Field of the Invention

The present invention relates to semiconductor chip packaging. More particularly, the present invention relates to semiconductor package assemblies configured to accept both flip-chip and wirebond semiconductor chips.

2. The Relevant Technology

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The term "electronic component" refers to any device or structure which may be connected to and respond to an electrical power or signal source, and includes, but is not limited to, semiconductor dies, semiconductor substrates, and integrated circuits as described above.

Semiconductor dies are commonly packaged to produce devices in a form for convenient use by consumers. Packaging steps are conducted to provide signal and power distribution to and from the semiconductor die, to dissipate heat from the semiconductor die, and to physically protect the semiconductor die. There is an ongoing effort in the semiconductor industry to reduce packaging costs, to improve electrical and thermal performance, and to reduce size.

An important packaging process is that of mounting and electrically connecting a semiconductor die to a mounting substrate such as a printed circuit board. A printed circuit board has a series of internal and external printed wires for electrically connecting two or more semiconductor dies or other electronic components that are mounted or attached thereto. Commonly, a semiconductor die is mounted over a receiving member that is in turn attached to the mounting substrate. Often, the receiving member is also a printed circuit board. The receiving member has a series of internal electrically conductive traces, each of which extends between at least two contact sites. One contact site is positioned to provide electrical connection with a bond pad on the semiconductor die, while the other contact site is located so as to provide electrical connection with the mounting substrate. Thus, a semiconductor package assembly formed according to the above-described process includes a semiconductor die mounted over a receiving member, which is in turn attached to a mounting substrate.

Semiconductor dies are structured according to one of at least two available designs: wirebond and flip-chip. Wirebond semiconductor dies have a set of bond pads arrayed on a face thereof. These semiconductor dies are packaged on a mounting substrate such that the face having the bond pads faces away from the receiving member and the mounting substrate. The bond pads are then wired to corresponding contact sites on the receiving member. In contrast, the bond pads of a flip-chip semiconductor die are arrayed on the opposite face. The face of a flip-chip that has the bond pads is disposed directly on the receiving member. An array of solder balls or other conductive material provides electrical connection between the bond pads of the flip-chip and the contact sites of the receiving member.

Manufacturers may find it commercially desirable to produce any specific integrated circuit according to both the wirebond and flip-chip designs. For example, one customer may demand a flip-chip, while another customer may be satisfied with a wirebond semiconductor die. However, such dual design of integrated circuits has required two corresponding receiving members, one configured to receive a flip-chip, and the other to receive the wirebond semiconductor die. Dual design of receiving members is expensive for the manufacturer—it requires increased inventory and redundant design and effort. The cost of producing and keeping in inventory dual receiving members may make production of dually designed integrated circuits prohibitive, thereby preventing market demand from being satisfied. It will be appreciated that a receiving member that is capable of receiving either a flip-chip or a wirebond semiconductor die, as needed, would be advantageous.

SUMMARY OF THE INVENTION

The present invention is directed to a semiconductor package assembly that is configured to include or receive either a flip-chip or a wirebond semiconductor die. According to the invention, one receiving member design is sufficient to provide packaging for both the flip-chip and wirebond designs of a semiconductor die. Thus, a single receiving member can be used with either a flip-chip or wirebond semiconductor die according to customer demand or other design constraints. Various embodiments, of the invention include a receiving member alone or a receiving member in combination with one or both of a mounting substrate and an electronic component.

The receiving member according to the invention has a component receiving surface with a component receiving region thereon. The component receiving region is configured to receive an electronic component. The component receiving region is defined and bounded by a perimeter that corresponds to the periphery of the electronic component. Accordingly, an electronic component mounted over a component receiving surface will be aligned with and substantially positioned over the component receiving region.

According to a preferred embodiment of the invention, a plurality of first contact sites and a plurality of second contact sites are arrayed on the component receiving surface. The first contact sites are positioned within the perimeter of the component receiving region, and provide electrical connection with the bond pads of a flip-chip. The second contact sites are positioned outside of the perimeter, and provide electrical connection with the bond pads of a wirebond electronic component. Electrically conductive traces within the receiving member connect the first contact sites and the second contact sites with terminal contact sites positioned on a surface of the receiving member. Each trace connects one corresponding first contact site, one corresponding second contact site, and one corresponding terminal contact site.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings.

Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

According to the present invention, a semiconductor package assembly is provided that is configured to accept or include either of a flip-chip or a wirebond semiconductor die. In one embodiment of the invention, a receiving member is capable of receiving a semiconductor die in either a flip-chip or wirebond orientation. In a further embodiment, the assembly includes the receiving member attached to a semiconductor die in either the flip-chip or wirebond orientation.

Figure 1:
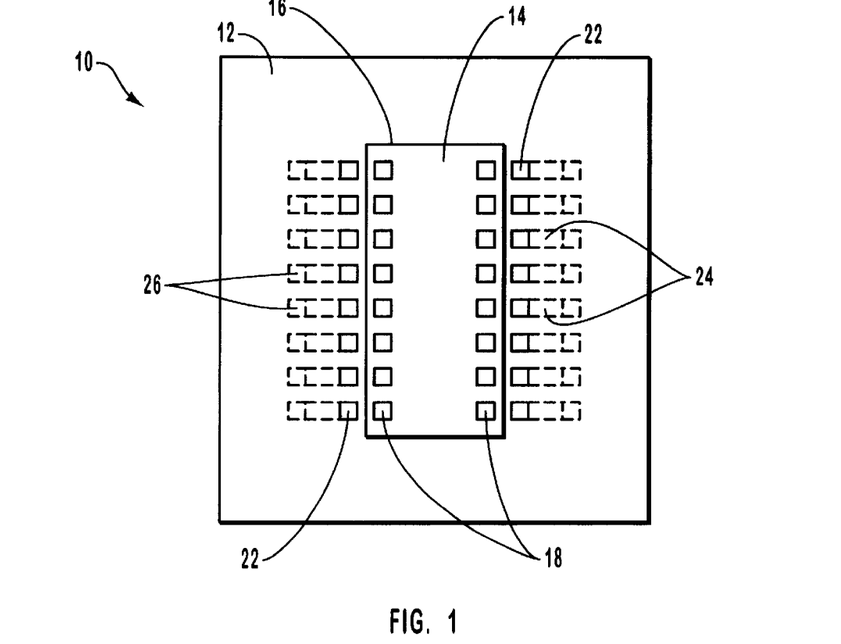
FIG. 1 is a top view of a receiving member configured for receiving an electronic component.

Shown in FIG. 1 is a semiconductor die receiving member 10 in a first embodiment. Semiconductor die receiving member 10 has a die receiving surface 12 configured to accept a semiconductor die, an integrated circuit wafer, or another electronic component. The receiving members of the invention are particularly useful for mounting semiconductor dies, but other electronic components that are conventionally mounted over receiving members are contemplated by the invention. Accordingly, semiconductor die receiving member 10 is disclosed herein as a preferred embodiment, but it will be understood that the invention extends to other receiving members configured to accept other electronic components.

A semiconductor die that is to be mounted over semiconductor die receiving member 10 would be positioned over die receiving region 14 of die receiving surface 12. Die receiving region 14 is bounded and defined by a perimeter 16 that corresponds to and has substantially the same dimensions as the periphery of the semiconductor die with which semiconductor die receiving member 10 is to be used. Thus, semiconductor die receiving member 10 is configured to receive a semiconductor die that can be positioned over die receiving region 14, thereby substantially covering die receiving region 14.

As seen in FIG. 1, a plurality of first contact sites 18 are arrayed on die receiving surface 12. Preferably, first contact sites 18 are positioned within perimeter 16. Further, a plurality of second contact sites 22 are arrayed on die receiving surface 12, preferably outside of perimeter 16. First and second contact sites 18 and 22 are located on semiconductor die receiving member 10 to provide electrical connection with a mounted semiconductor die in the flip-chip and wirebond orientations, respectively. In FIG. 1, it can be seen that first contact sites 18 are configured to lie underneath a semiconductor die when the die is proximate die receiving region 14. Moreover, second contact sites 22 are configured to lie adjacent a semiconductor die when the die is proximate die receiving region 14. However, the invention also extends to all configurations wherein contact sites 18 and 22 are situated on semiconductor die receiving member in an arrangement whereby electrical connection may be established with a mounted flip-chip component through first contact sites 18 and with a mounted wirebond component through second contact sites 22.

A plurality of electrically conductive traces 24 (shown in phantom) are contained within semiconductor die receiving member 10. Traces 24 electrically connect first contact sites 18 with second contact sites 22. Each trace 24 corresponds with one of first contact sites 18 and with one of second contact sites 22 such that each first contact site 18 is electrically connected with exactly one second contact site 22 and vice versa. Further, traces 24 are routed through semiconductor die receiving member 10 to a plurality of terminal contact sites 26 (shown in phantom) positioned on an external circuitry receiving region of semiconductor die receiving member 10. Again, each trace 24 corresponds with one of terminal contact sites 26 such that each terminal contact site 26 is electrically connected with exactly one trace 24. Traces 24 are insulated from the external environment and one from another by dielectric material contained in semiconductor die receiving member 10. Terminal contact sites 26 are intended to provide electrical connection between semiconductor die receiving member 10 and external circuitry. Accordingly, terminal contact sites 26 are positioned on any surface of semiconductor die receiving member 10 to which an electronic component or a device or structure having circuitry may be connected. As seen in FIG. 1, the first preferred embodiment of semiconductor die receiving member 10 has terminal contact sites 26 that are exposed on a surface opposite die receiving surface 12.

Semiconductor die receiving member 10 functions to provide power and signal distribution to and from semiconductor dies mounted thereon and to give rigidity to packaged semiconductor structures. Semiconductor die receiving member 10 may be any structure, including multilayer structures, through which traces 24 may be routed between contact sites 18, 22 and 26. It will be recognized by those skilled in the relevant art that a wide variety of materials may be used in semiconductor die receiving member 10. For example, printed circuit boards are currently widely used as semiconductor die receiving members. Other suitable structures include, but are not limited to, fiberglass structures and multilayer ceramics, such as those containing alumina ceramic. Moreover, semiconductor die receiving member 10 may be a semiconductor substrate, such as a selectively doped silicon wafer, silicon on insulator, silicon on sapphire, or the like.

Semiconductor die receiving member 10 is produced according to known methods of printing or constructing conductive wiring and layers within a dielectric or semiconductor substrate. For example, semiconductor die receiving member 10 may contain a series of vias, through-holes and deposited metal traces. The dimensions of semiconductor die receiving member 10 depend on the application in which it is to be used. Often, however, it will be preferable for semiconductor die receiving member 10 to be a relatively thin, laminar structure, thereby keeping package size to a minimum.

Contact sites 18, 22 and 26 are electrically conductive surfaces to which circuitry within semiconductor dies or external devices or structures may be connected. Contact sites 18, 22 and 26 may be exposed on semiconductor die receiving member 10 flush with the surface, such as die receiving surface 12, on which they are positioned. Alternatively, contact sites 18, 22 and 26 may be recessed from the surface of semiconductor die receiving member 10 through which they are exposed, in which case they may be merely exposed surfaces of traces 24. In still an alternate form, contact sites 18, 22 and 26 may protrude beyond the surface of semiconductor die receiving member 10 on which they are exposed.

Semiconductor die receiving member 10 may be configured to mount to a mounting substrate, thereby providing electrical connection between terminal contact sites 26 and external circuitry. Alternatively, semiconductor die receiving member 10 may contain a plurality of die receiving regions 14, such that more than one semiconductor die may be mounted thereon. In one variation on this alternative, semiconductor die receiving member 10 would be mounted over a mounting substrate such that each semiconductor die is electrically connected with the mounting substrate. In such an embodiment, semiconductor die receiving member 10 would have pluralities of third, fourth, etc., contact sites to correspond with the multiple die receiving regions.

In another variation on the multiple semiconductor die embodiment, semiconductor die receiving member 10 may provide for direct electrical interconnection between semiconductor dies mounted thereon, without use of a separate mounting substrate. For example, semiconductor die receiving member 10 may be a printed circuit board, such as a motherboard, designed to accept several semiconductor dies. In such an embodiment, a first die receiving region would be associated with first contact site 18 and second contact site 22. A second die receiving region would be associated with at least a third contact site. Trace 24 would lead directly from contact sites 18 and 22 to the third contact site, thereby electrically connecting the first and second semiconductor dies.

Figure 2:
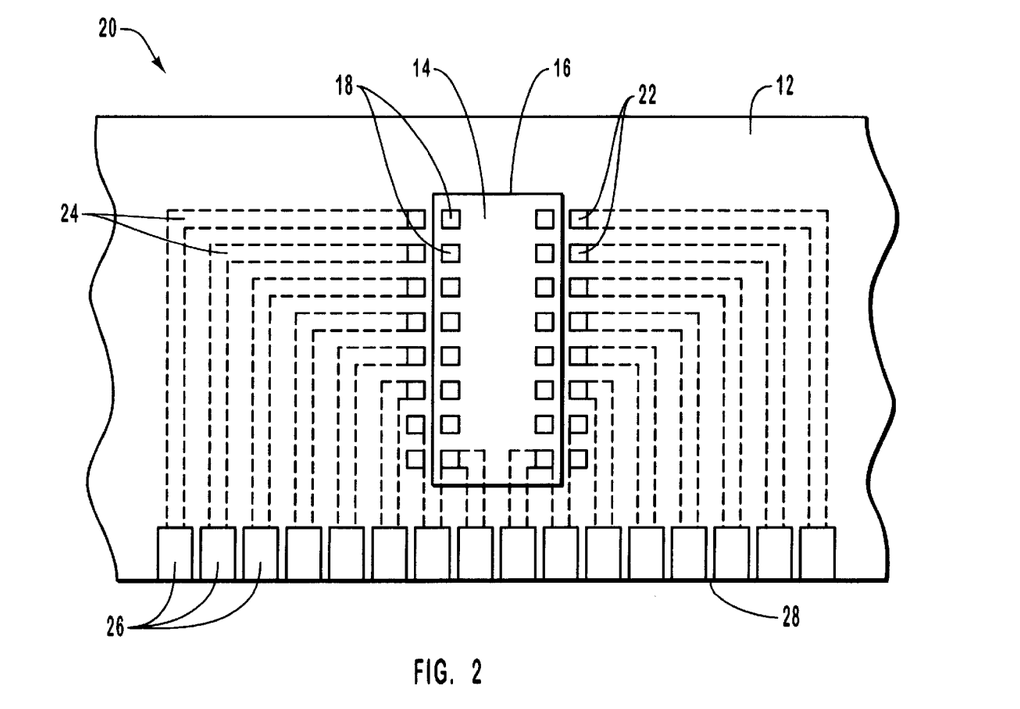
FIG. 2 is a top view of another receiving member configured for receiving an electronic component.

As shown in FIG. 2, semiconductor die receiving member 20 is a second embodiment of a structure according to the invention. Semiconductor die receiving member 20 is substantially configured as is semiconductor die receiving member 10 of FIG. 1, differing primarily in the relative arrangement of terminal contact sites 26 and electrically conductive traces 24 with die receiving region 14. Terminal contact sites 26 are arrayed along a package mount edge 28 that is laterally adjacent to die receiving surface 12.

Figure 3:
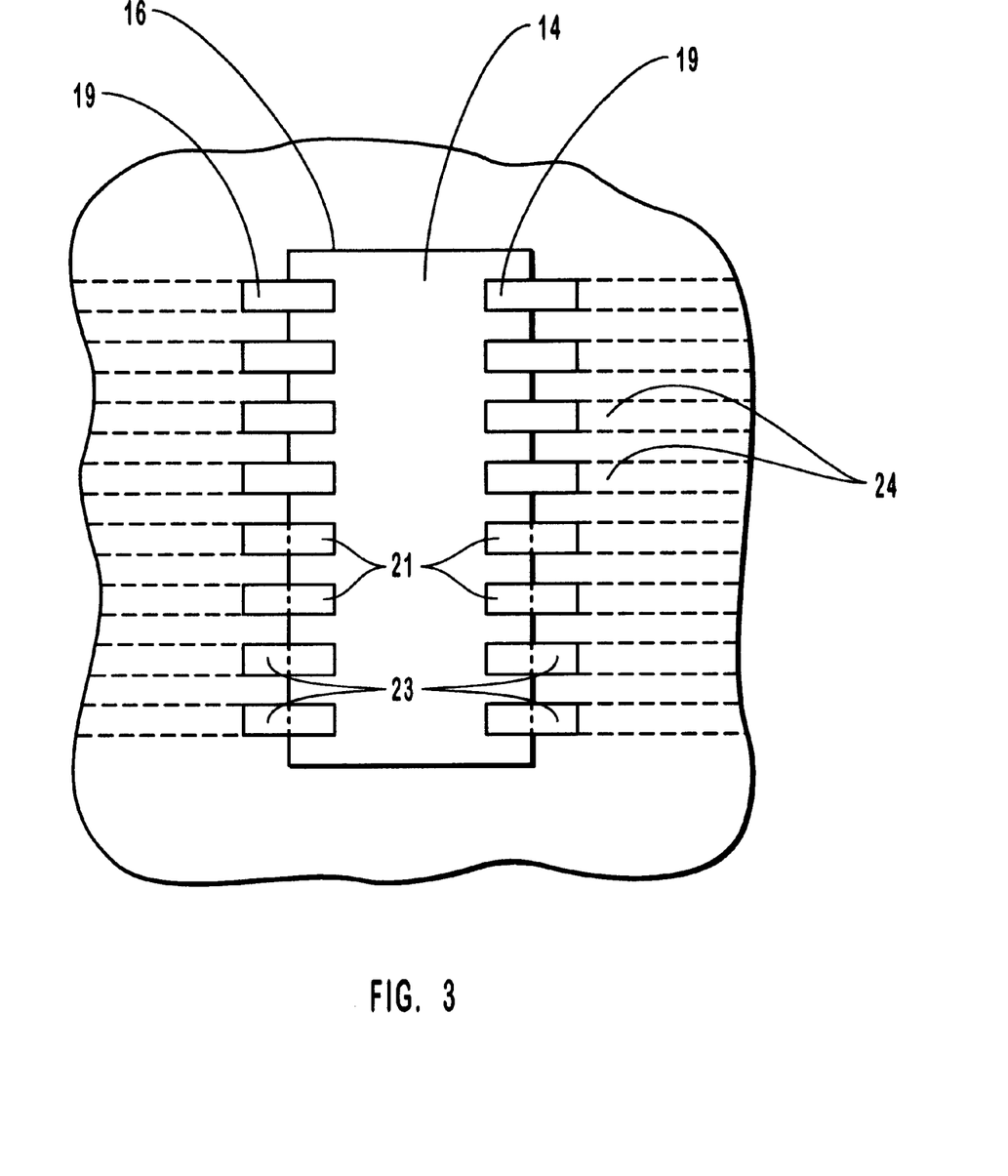
FIG. 3 is a top view of the receiving member of either FIG. 1 or FIG. 2, wherein a plurality of first contact sites and a plurality of second contact sites are replaced with contact sites that may be used with either wirebond or flip-chip components.

FIG. 3 shows an alternative embodiment of the receiving member of the present invention. In this embodiment, the plurality of first contact sites 18 and the plurality of second contact sites 22 of FIGS. 1 and 2 are combined, thereby providing a plurality of dual-purpose contact sites 19. In effect, dual-purpose contact sites 19 are provided by increasing the area extent of and merging first contact sites 18 and second contact sites 22. Dual-purpose contact sites 19 each have a first portion 21 positioned within perimeter 16 and a second portion 23 outside of perimeter 16. When a semiconductor die is mounted over die receiving region 14 in a flip-chip orientation, electrical connection to the semiconductor die is provided by first portion 21. When a semiconductor die is mounted over die receiving region 14 in a wirebond orientation, electrical connection to the semiconductor die is provided by second portion 23. Accordingly, dual-purpose contact sites 19 are configured to provide electrical connection with a semiconductor die whether in a flip-clip or wirebond mounting orientation.

Figure 4:
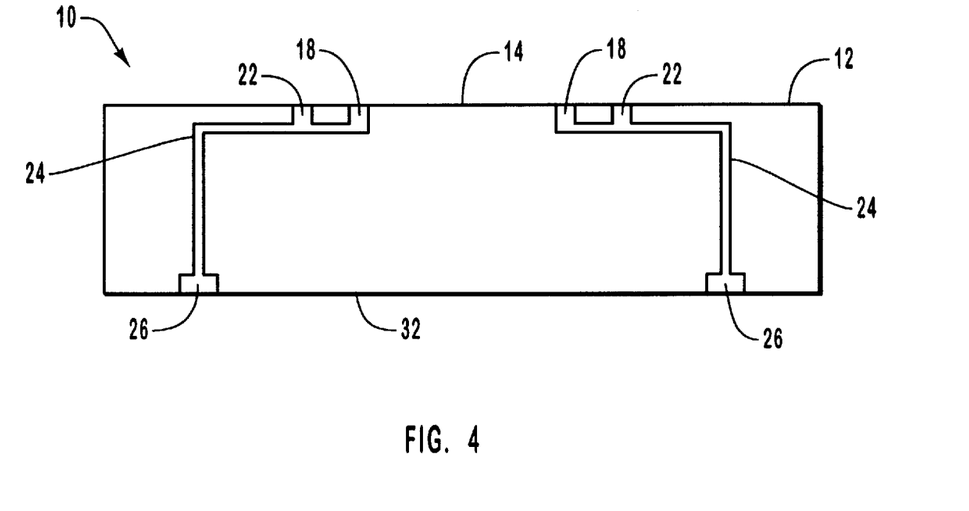
FIG. 4 is a cross section elevation view of the receiving member of FIG. 1.

FIG. 4 illustrates semiconductor die receiving member 10 of FIG. 1 in cross section elevation view. As can be seen, terminal contact sites 26 emerge to a package mount surface 32 opposite die receiving surface 12. Traces 24 allow electrical current and signals to pass between die receiving surface 12 and package mount surface 32.

Figure 5:
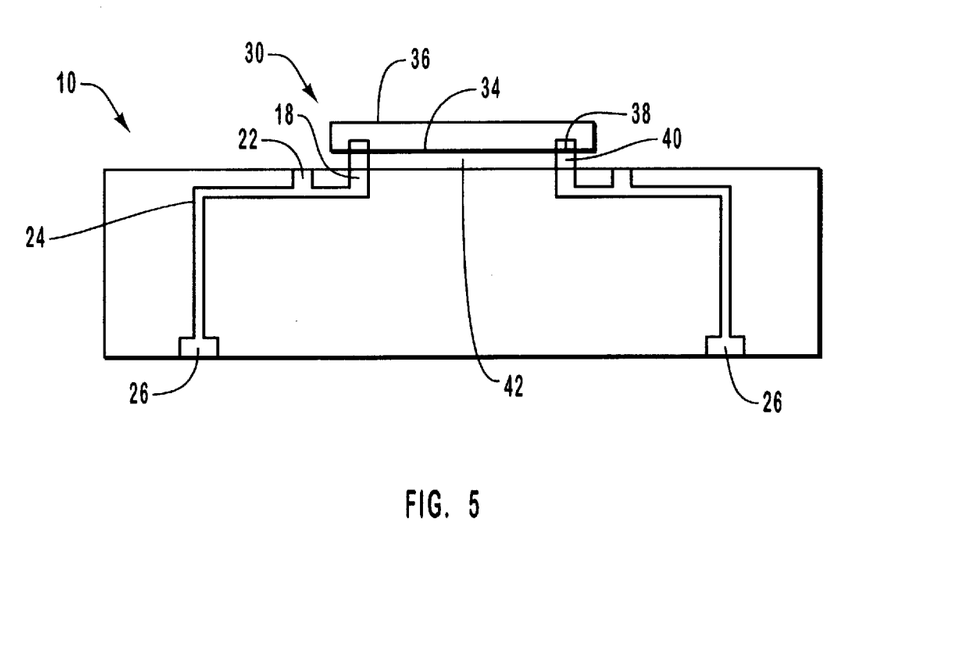
FIG. 5 is a cross section elevation view of a semiconductor package assembly including the receiving member of FIG. 1 in combination with an electronic component in the flip-chip orientation.
Figure 6:
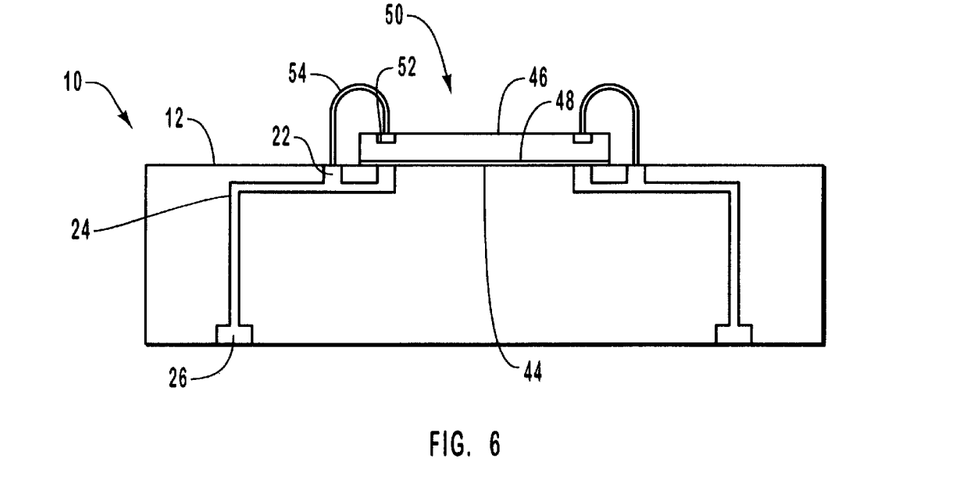
FIG. 6 is a cross section elevation view of a semiconductor package assembly including the receiving member of FIG. 1 in combination with an electronic component in the wirebond orientation.

Referring to FIGS. 5 and 6, a semiconductor package assembly is shown according to the invention, including semiconductor die receiving member 10 of FIG. 1 in combination with one of two semiconductor dies: flip-chip semiconductor die 30 and wirebond semiconductor die 50. Semiconductor dies 30 and 50, which may be memory or logic chips, represent two alternative methods of configuring a semiconductor die for connection with external circuitry. Flip-chips are designed with bond pads arranged such that they may be placed in direct contact with contact sites of a semiconductor die receiving member. The face of a flip-chip that contains bond pads is disposed on the die receiving surface. In contrast, wirebond semiconductor dies have bond pads on the opposite surface. A wirebond component is packaged such that the face having bond pads faces away from its semiconductor die receiving member. Wires are bonded between the bond pads and corresponding contact sites on the semiconductor die receiving member.

Seen in FIG. 5 is a connection between semiconductor die receiving member 10 and flip-chip semiconductor die 30. Semiconductor die 30 has a first face 34 and an opposite second face 36. A plurality of bond pads 38 are arrayed on first face 34. First face 34 is disposed over die receiving region 14, such that bond pads 38 are aligned with corresponding first contact sites 18. A conductive material 40 is provided between bond pads 38 and contact sites 18 to facilitate electrical connection therebetween. Conductive material 40 may be solder balls, conductive polymer balls, or other suitable conductive material. A dielectric adhesive underfill 42 is preferably applied between first surface 34 and die receiving region 14 to securely attach semiconductor die 30 to semiconductor die receiving member 10. Accordingly, semiconductor die 30 is attached to semiconductor die receiving member 10 in the flip-chip orientation, which will also be termed "first orientation" hereinafter. Electrical connection is provided from bond pad 38 through conductive material 40, first contact site 18, and trace 24, to terminal contact site 26.

FIG. 6 depicts semiconductor die receiving member 10 in combination with wirebond semiconductor die 50. Semiconductor die 50 has a first face 46 and an opposite second face 48. A plurality of bond pads 52 are arrayed on first face 46. In this embodiment, semiconductor die receiving member 10 includes a thin adhesive layer 44 disposed on a portion of die receiving region 14. Adhesive layer 44 is relatively thin in comparison with the thickness of semiconductor die 50. Second face 48 is disposed directly on adhesive layer 44 to cause a bond to form therebetween. Wiring 54 is extended between bond pads 52 and second contact sites 22 according to methods known in the art.

Thus, semiconductor die 50 is attached to semiconductor die receiving member 10 in the wirebond orientation, which will also be termed "second orientation" hereinafter. Electrical connection is thereby provided from bond pad 52, through wiring 54, second contact site 22, and trace 24, to terminal contact site 26.

It will be understood that semiconductor die receiving member 20 as illustrated in FIG. 2 is also configured to receive semiconductor dies 30 and 50 of the respective flip-chip and wirebond designs. Semiconductor dies 30 and 50 may be attached to semiconductor die receiving member 20 as described above in reference to FIGS. 5 and 6. Accordingly, semiconductor package assemblies are provided under the present invention having semiconductor die receiving member 20 combination with either of semiconductor die 30 or semiconductor die 50.

Figure 7:
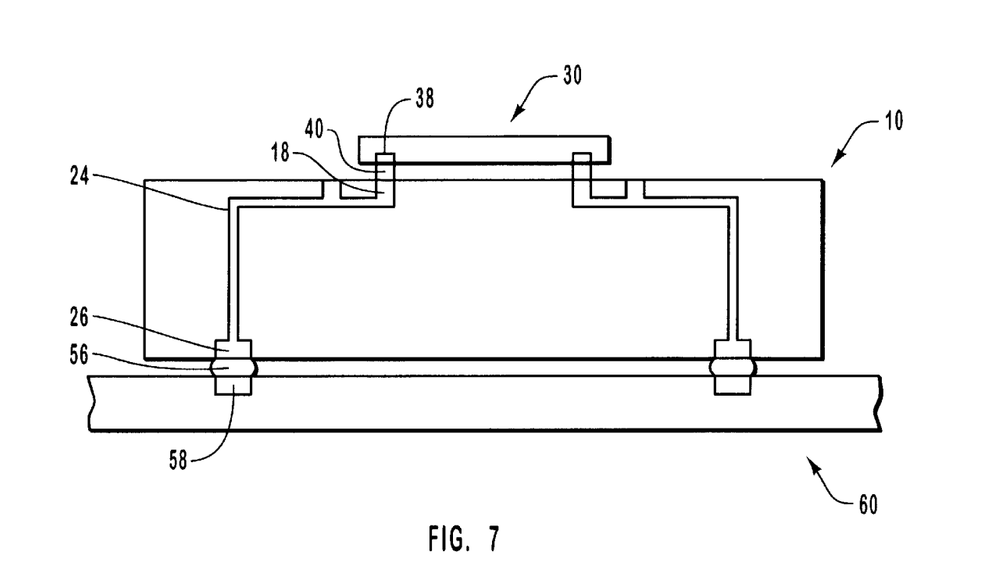
FIG. 7 is a cross section elevation view of the semiconductor package assembly of FIG. 5 attached to a mounting substrate.

Turning to FIG. 7, a semiconductor package assembly as described above in Reference to FIG. 5 is provided, with the addition of mounting substrate 60 on which semiconductor die receiving member 10 is mounted. As discussed above, the semiconductor package assembly provides electrical connection between bond pad 38 and terminal contact site 26. Inclusion of mounting substrate 60 in the semiconductor package assembly allows electrical connection to extend to external circuitry contained in any chosen component, device or structure. Mounting substrate 60 has a plurality of contact pads 58 positioned to correspond to the plurality of terminal contact sites 26. Semiconductor die receiving member 10 is disposed over mounting substrate 60 so as to align terminal contact sites 26 with corresponding contact pads 58. Semiconductor die receiving member 10 is thereby positioned parallel to mounting substrate 60. A conductive material 56 is provided at the interface between terminal contact sites 26 and contact pads 58 to establish electrical connection therebetween. An adhesive material (not shown) optionally may be used to strengthen the bond between semiconductor die receiving member 10 and mounting substrate 60.

Mounting substrate 60 is commonly a printed circuit board. For example, semiconductor die receiving member 10 may be mounted over a printed circuit motherboard. However, it will be recognized by those skilled in the relevant art that a wide variety of structures and materials may serve as a mounting substrate 60. Other suitable structures include, but are not limited to, fiberglass structures and multilayer ceramics, such as those containing alumina ceramic. Moreover, mounting substrate 60 may be a semiconductor substrate, such as a selectively doped silicon wafer, silicon on insulator, silicon on sapphire, or the like.

Mounting substrate 60 is produced according to appropriate known methods, such as printing or otherwise constructing conductive wiring and layers within a dielectric or semiconductor substrate. The dimensions of mounting substrate 60 depend on the application in which it is to be used. Often, however, it will be preferable for mounting substrate 60 to be a relatively thin, laminar structure, thereby keeping package size to a minimum. A plurality of semiconductor die receiving members 10, with their corresponding semiconductor dies, may be mounted over a mounting substrate, thereby providing communication and coordination between two or more semiconductor dies.

Figure 8:
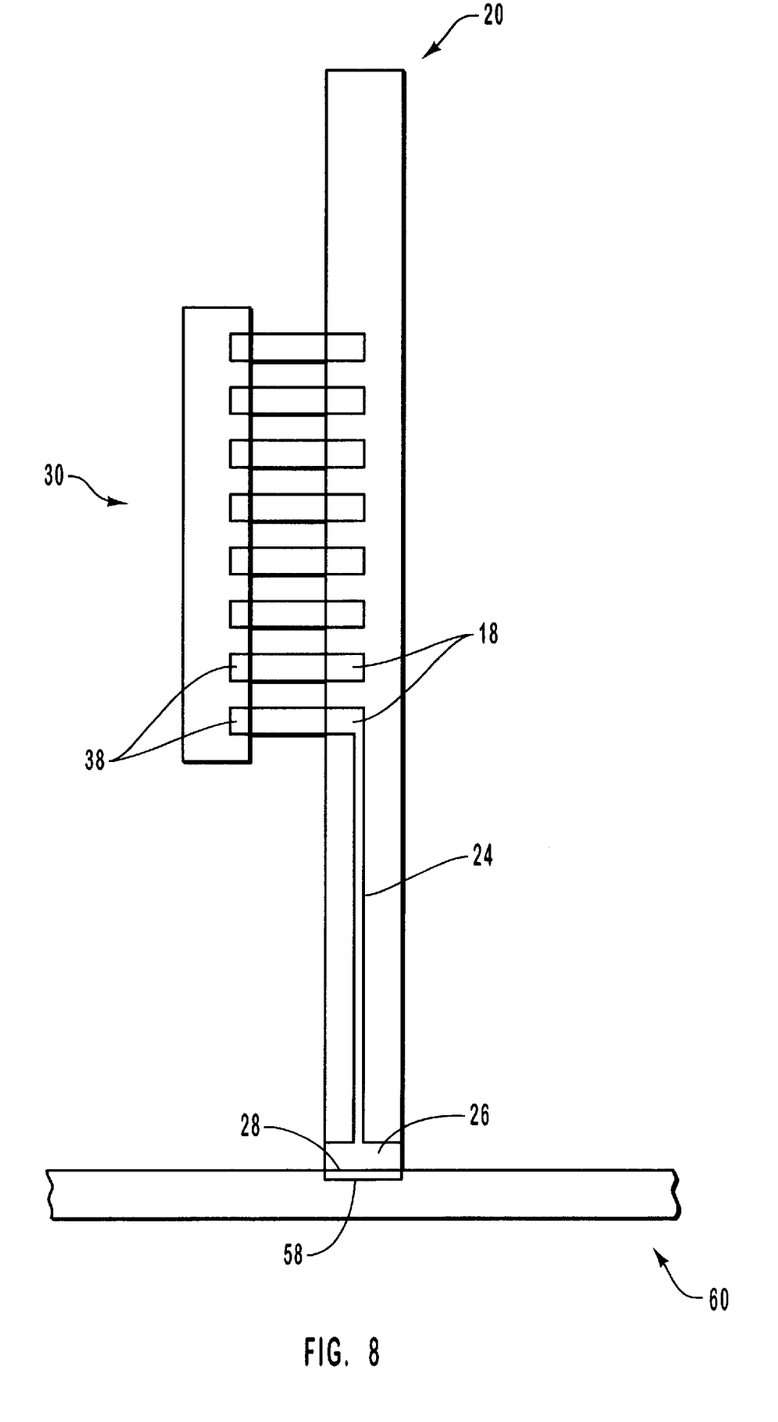
FIG. 8 is a cross section elevation view of a semiconductor package assembly including the receiving member of FIG. 2 in combination with an electronic component and attached to a mounting substrate.

Referring to FIG. 8, a semiconductor package assembly in a further embodiment is shown, including semiconductor die receiving member 20, semiconductor die 30 in the flip-chip orientation, and mounting substrate 60. Alternatively, semiconductor die 50 in the wirebond orientation can be substituted for semiconductor die 30 in the flip-chip orientation. Mounting substrate 60 has a plurality of contact pads 58 that correspond to terminal contact sites 26. Semiconductor die receiving member 20, with mounted semiconductor die 30, is positioned so that package mount edge 28 is positioned over mounting substrate 60, with terminal contact sites 26 being aligned with corresponding contact pads 58. Semiconductor die receiving member 20 is conductively attached to mounting substrate 60 such that a conductive interface is formed between terminal contact sites 26 and contact pads 58. Semiconductor die receiving member 20 is thereby positioned substantially orthogonal relative to mounting substrate 60. Alternatively, semiconductor die receiving member 20 may connect with mounting substrate 60 in an oblique angle. In this embodiment, mounting substrate 60 in FIG. 8 may be any structure or material as described above in reference to mounting substrate 60 in FIG. 7.

The semiconductor package assembly as described above in reference to FIG. 8 is commonly known as a card-on-board assembly, where mounting substrate 60 is a board, or motherboard, and semiconductor die receiving member 20 is a card, or a "daughterboard". The card-on-board assembly is especially useful for efficiently packaging memory chips, whereas logic chips are more frequently packaged according to the assembly described above in reference to semiconductor die receiving member 10.

According to the above described and other embodiments, a versatile semiconductor die receiving member and associated semiconductor package assembly are disclosed. The assembly accepts semiconductor dies in either the flip-chip or wirebond orientation. Moreover, the semiconductor die receiving member may be attached to a mounting substrate in a parallel or orthogonal orientation.

The present invention has application to a wide variety of semiconductor packaging assemblies other than those specifically described herein. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A semiconductor die receiving member comprising:
   a die receiving surface for receiving a packaged die adhered thereto;
   a plurality of electrically conductive first contact sites upon the die receiving surface for electrically connecting to a respective plurality of bond pads of a flip-chip configuration of said packaged die;
   a plurality of electrically conductive second contact sites upon the die receiving surface for electrically connecting to a respective plurality of bond pads of a wirebond configuration of said packaged die, said die receiving surface providing electrical isolation around each said first and second contact sites; and
   a substrate having said die receiving surface on one side, an external circuitry receiving region on an opposite side, and a plurality of electrically conductive traces passing through said substrate between said opposing sides, wherein:
     the external circuitry receiving region has a plurality of terminal contact sites; and each said electrically conductive trace places each said first contact site in electrical communication with a respective one of:
the second contact sites; and
the terminal contact sites.

2. A semiconductor die receiving member as recited in claim 1, wherein the die receiving surface extends contiguously between and makes contact with each of the first and second contact sites.

3. A semiconductor die receiving member as recited in claim 1, further comprising a mount surface opposite the die receiving surface, wherein:
a dielectric material is situated between the die receiving surface and the mount surface; and
each first contact site of said plurality of first contact sites is in electrical connection with a respective one second contact site of said plurality of second contact sites through an electrical connection trace within said dielectric material.

4. A semiconductor die receiving member as recited in claim 1, wherein each said electrically conductive trace extends within the substrate to terminate at a plurality of regions upon an exposed surface of the substrate.

5. A semiconductor die receiving member as recited in claim 1, wherein:
said plurality of first contact sites include a pair of groups of co-linearly arranged first contact sites;
said plurality second contact sites include a pair of groups of co-linearly arranged second contact sites.

6. A semiconductor die receiving member as recited in claim 5, wherein each said first contact side is co-linear with two of said second contact sites.

7. A semiconductor die receiving member configured for mounting a semiconductor die thereover, said semiconductor die receiving member comprising:
a die receiving surface having a die receiving region thereon for adhering to a packaged die having a periphery, said die receiving region being bounded by a perimeter corresponding to the periphery of said packaged die;
a dielectric material upon which the die receiving surface is situated; and
a plurality of electrically conductive traces within said dielectric material, each electrically conductive trace providing electrical connection between:
a contact site on said die receiving surface, wherein:
a first portion of said contact site is positioned within said perimeter,
a second portion of said contact site is positioned outside of said perimeter;
the first and second portions are electrically connected by an electrical connectors situated upon the die receiving surface; and
the die receiving surface provides electrical isolation around each said first and second portions of said contact site;
a terminal contact site on an external circuitry receiving region of said semiconductor die receiving member, said external circuitry receiving region being situated upon a side of said dielectric material that is opposite a side that upon which said die receiving surface is situated.

8. A semiconductor die receiving member as recited in claim 7, wherein:
a plurality of said first portions of said contact sites include a pair of groups of co-linearly arranged first portions; and
a plurality of said second portions of said contact sites include a pair of groups of co-linearly arranged second portions.

9. A semiconductor die receiving member as recited in claim 8, wherein each said first portion is co-linear with two of said second portions.

10. A semiconductor die receiving member configured for mounting a semiconductor die thereover, said semiconductor die receiving member comprising:
a die receiving surface having a die receiving region thereon for adhering to a packaged die having a periphery, said die receiving region being bounded by a perimeter corresponding to the periphery of said packaged die;
a dielectric material upon which the die receiving surface is situated; and
a plurality of electrically conductive traces within said dielectric material, each electrically conductive trace providing electrical connection between a respective one of:
a first electrically conductive contact site on said die receiving surface within said perimeter for electrically connecting to a respective bond pad of a flip-chip configuration of said packaged die;
a second electrically conductive contact site on said die receiving surface outside of said perimeter for electrically connecting to a respective bond pad of a wirebond configuration of said packaged die, wherein the die receiving surface provides electrical isolation around each said first and second electrically conductive contact sites; and
a terminal contact site on an external circuitry receiving region of said semiconductor die receiving member that is situated upon a side of said dielectric material that is opposite a side upon which said die receiving surface is situated.

11. A semiconductor die receiving member configured for mounting a semiconductor die thereover, said semiconductor die including first and second opposing faces, said first face having thereon a bond pad, said semiconductor die receiving member comprising:
a die receiving surface having a die receiving region thereon for adhering to a packaged die having a periphery, said die receiving region being bounded by a perimeter corresponding to the periphery of said packaged die;
a dielectric material upon which the die receiving surface is situated; and
an electrically conductive trace electrically insulated by and within said dielectric material, said electrically conductive trace being in electrical connection with a respective one of each of:
a first electrically conductive contact site on said die receiving surface within said perimeter for electrically connecting to the bond pad of a flip-chip configuration of said packaged die such that the first face is closer to the die receiving surface than the second face;
a second electrically conductive contact site on said die receiving surface outside of said perimeter for electrically connecting to the bond pad of a wirebond configuration of the packaged die such that the second face is closer to the die receiving surface than the first face, wherein the die receiving surface provides electrical isolation around each said first and second electrically conductive contact sites; and a terminal contact site for providing electrical connection of said first contact site and said second contact site with external circuitry, said terminal contact site being situated upon a side of said dielectric material that is opposite a side upon which said die receiving surface is situated.

12. A semiconductor die receiving member as recited in claim 11, wherein said first and second electrically conductive contact sites are electrically connected by an electrically conductive trace extending therebetween and within the dielectric material.

13. A semiconductor die receiving member as recited in claim 12, further comprising a package mount surface opposite said die receiving surface, said terminal contact site being positioned on said package mount surface, said package mount surface being configured to attach to a mounting substrate.

14. A semiconductor die receiving member as recited in claim 12, further comprising a package mount edge laterally adjacent to said die receiving surface, said terminal contact site being positioned on said package mount edge, said package mount edge being configured to attach to a mounting substrate.

15. A semiconductor package assembly comprising:
a semiconductor die receiving member including:
a die receiving surface having a die receiving region thereon;
a dielectric material upon which the die receiving surface is situated;
an external circuitry receiving region situated upon said dielectric material and separated by the die receiving surface from the die receiving region, said external circuitry receiving surface having thereon a plurality of terminal contact sites;
a plurality of electrically conductive first contact sites upon the die receiving surface;
a plurality of electrically conductive second contact sites upon the die receiving surface, wherein the die receiving surface provides electrical isolation around each said first and second electrically conductive contact sites; and
a plurality of electrically conductive traces within said dielectric material each providing electrical connection a respective one of each of said first, second, and terminal contact sites; and
a semiconductor die having a first face, a second face opposite said first face, and a plurality of bond pads arrayed on said first face, said semiconductor die being mounted over said die receiving surface in one of:
a first orientation, wherein:
said first face is nearer said die receiving surface than is said second face; and
said plurality of bond pads are in electrical connection with said plurality of electrically conductive traces through said plurality of first contact sites upon the die receiving surface; and
a second orientation, wherein:
said second face is nearer said die receiving surface than is said first face; and
said plurality of bond pads are in electrical connection with said plurality of electrically conductive traces through said plurality of second contact sites upon the die receiving surface.

16. A semiconductor package assembly as recited in claim 15, wherein said semiconductor die is a flip-chip mounted over said die receiving surface in said first orientation.

17. A semiconductor package assembly as recited in claim 15, wherein said semiconductor die is a wirebond chip mounted over said die receiving surface in said second orientation.

18. A semiconductor package assembly as recited in claim 15, wherein said semiconductor die is a memory chip.

19. A semiconductor package assembly as recited in claim 15, wherein said semiconductor die is a logic chip.

20. A semiconductor package assembly as recited in claim 15, wherein:
said plurality of first contact sites include a pair of groups of co-linearly arranged first contact sites;
said plurality of second contact sites include a pair of groups of co-linearly arranged second contact sites.

21. A semiconductor package assembly as recited in claim 20, wherein each said first contact side is co-linear with two of said second contact sites.

22. A semiconductor package assembly comprising:
a semiconductor die package having a plurality of bond pads arrayed on a first face thereof that is opposite a second face, said semiconductor die package being in one of a flip-chip orientation and a wirebond orientation;
a semiconductor die receiving member having:
a die receiving surface situated upon one side of said semiconductor receiving member and including a die receiving surface having said semiconductor die package thereon;
an external circuitry receiving region situated upon one of:
an opposite side of said semiconductor die receiving member; and
and an edge of semiconductor die receiving member that is laterally adjacent to said die receiving surface;
a plurality of electrically conductive traces electrically insulated within and extending between said opposing sides of said semiconductor die receiving member, each being electrically connected to one of said bond pads, and having:
a first contact site on said die receiving surface;
a second contact site on said die receiving surface, wherein the die receiving surface electrical isolates each said first and second electrically conductive contact sites; and
a terminal contact site on said external circuitry receiving region configured to provide electrical connection with external circuitry; and wherein:
for the flip-chip orientation of said semiconductor die package, each said first contact site is configured to lie immediately beneath and be electrically connected to a respective one said bond pads; and
for the wirebond orientation of said semiconductor die package, each said second contact site is electrically connected to a respective one said bond pads and the second face is closer to the die receiving surface than the first face.

23. A semiconductor package assembly as recited in claim 22, wherein said semiconductor die package is mounted over said die receiving region such that said first face is juxtapose said die receiving region.

24. A semiconductor package assembly as recited in claim 23, wherein:
said semiconductor die package is said flip-chip orientation;
each of said bond pads corresponds to one of said first contact sites; and
said semiconductor package assembly further comprises a conductive material interposed between each of said bond pads and said first contact site that corresponds thereto.

25. A semiconductor package assembly as recited in claim 22, wherein said semiconductor die package is mounted over said die receiving region such that said second face is juxtapose said die receiving region.

26. A semiconductor package assembly as recited in claim 25, wherein:
said semiconductor die package is said wirebond orientation;
each of said bond pads corresponds to one of said second contact sites; and
said semiconductor assembly further comprises wiring extending between each of said bond pads and said second contact site that corresponds thereto.

27. A semiconductor package assembly as recited in claim 22, wherein said semiconductor die receiving member is a multilayer laminar structure.

28. A semiconductor package assembly as recited in claim 27, wherein said semiconductor die receiving member is a printed circuit board.

29. A semiconductor package assembly as recited in claim 22, wherein said semiconductor die receiving member comprises a multilayer ceramic.

30. A semiconductor package assembly as recited in claim 22, wherein said semiconductor die receiving member comprises fiberglass.

31. A semiconductor package assembly as recited in claim 22, wherein:
said semiconductor package assembly further comprises a mounting substrate wherein said external circuitry is located;
said semiconductor die receiving member is mounted over said mounting substrate such that said external circuitry receiving region is disposed over said mounting substrate; and
said terminal contact sites are in electrical connection with said external circuitry.

32. A semiconductor package assembly as recited in claim 31, wherein said mounting substrate is a printed circuit board.

33. A semiconductor package assembly as recited in claim 31, wherein:
said external circuitry receiving region is on said opposite side of said semiconductor die receiving member that is opposite said die receiving surface; and
the die receiving surface physically separates each said first and second electrically conductive contact sites one from another.

34. A semiconductor package assembly as recited in claim 31, wherein:
said external circuitry receiving region is on said edge of said semiconductor die receiving member that is laterally adjacent to said die receiving surface; and
said semiconductor die receiving member is mounted over said mounting substrate such that said die receiving surface is orthogonal to a plane defined by said mounting substrate.

35. A semiconductor package assembly as recited in claim 22, wherein:
said plurality of first contact sites include a pair of groups of co-linearly arranged first contact sites;
said plurality of second contact sites include a pair of groups of co-linearly arranged second contact sites.

36. A semiconductor package assembly as recited in claim 35, wherein each said first contact side is co-linear with two of said second contact sites.

37. A semiconductor package assembly comprising:
a semiconductor die package having a first face opposite a second face, wherein the first face has thereon a plurality of bond pads, said semiconductor die package being in one of a flip-chip orientation and a wirebond orientation;
a semiconductor die receiving member having an external circuitry receiving region and a die receiving surface that is opposite a mounting surface, wherein a dielectric material is situated between the die receiving surface and the mounting surface;
a plurality of electrically conductive traces electrically insulated by and extending within the dielectric material, each said electrically conductive trace corresponding to one of said bond pads and having a first contact site on said die receiving surface, a second contact site on said die receiving surface, and a terminal contact site on said external circuitry receiving region, wherein the die receiving surface surrounds and electrically isolates each of the first and second contact sites;
a mounting substrate having said semiconductor die receiving member mounted thereon, said mounting substrate having circuitry in electrical connection with said terminal contact sites; and
a die receiving region on said die receiving surface, wherein:
for the flip-chip orientation of said semiconductor die package, each said first contact site is configured to lie immediately beneath and be electrically connected to a respective one said bond pads; and
for the wirebond orientation of said semiconductor die package, each said second contact site is electrically connected to a respective one said bond pads and the second face is closer to the die receiving surface than the first face.

38. A semiconductor package assembly comprising:
a semiconductor die having a first face, a second face opposite said first face, and a periphery;
a plurality of bond pads arrayed on said first face of said semiconductor die;
a semiconductor die receiving member having a die receiving surface and a package mount surface opposite said die receiving surface;
a plurality of terminal contact sites on said package mount surface;
a plurality of first contact sites on said die receiving surface;
a plurality of second contact sites on said die receiving surface;
a die receiving region on said die receiving surface, said die receiving region having a perimeter corresponding to and defined by said periphery of said semiconductor die, said plurality of first contact sites being positioned within said perimeter, said plurality of second contact sites being positioned outside of said perimeter, said die receiving surface electrically isolating each first contact site within said perimeter from one said second contact sites outside said perimeter, said semiconductor die being mounted over said die receiving region in one of:
a first orientation wherein said first face is nearer said die receiving surface than is said second face, and wherein each of said bond pads is in electrical connection with one of said first contact sites that corresponds thereto; and a second orientation wherein said second face is nearer said die receiving surface than is said first face, and wherein each of said bond pads is in electrical connection with one of said second contact sites that corresponds thereto;

a plurality of electrically conductive traces, each electrically conductive trace corresponding to one of said first contact sites and one of said second contact sites and providing electrical connection therebetween, each electrically conductive trace further corresponding to one of said terminal contact sites and extending thereto inside the semiconductor die receiving member;

a mounting substrate on which said semiconductor die receiving member is mounted, said package mount surface being parallel to and juxtaposed said mounting substrate; and a plurality of contact pads on said mounting substrate in electrical connection with said terminal contact sites.

39. A semiconductor package assembly as recited in claim 38, wherein:

said first orientation further includes a conductive material interposed between each of said bond pads and said one of said first contact sites that corresponds thereto; and said second orientation further includes wiring extending between each of said bond pads and said one of said second contact sites that corresponds thereto.

40. A semiconductor package assembly as recited in claim 38, wherein said semiconductor die is a logic chip.

41. A semiconductor package assembly comprising:

a semiconductor die having a first face, a second face opposite said first face, and a periphery;

a plurality of bond pads arrayed on said first face of said semiconductor die;

a semiconductor die receiving member having a die receiving surface and a package mount edge laterally adjacent to said die receiving surface;

a plurality of terminal contact sites on said package mount edge;

a plurality of first contact sites on said die receiving surface;

a plurality of second contact sites on said die receiving surface;

a die receiving region on said die receiving surface, said die receiving region having a perimeter corresponding to and defined by said periphery of said semiconductor die, said plurality of first contact sites being positioned within said perimeter, said plurality of second contact sites being positioned outside of said perimeter, said die receiving surface physically separating and electrical isolating one said first contact site within the perimeter from a respective one of said second contact sites outside of the perimeter, said semiconductor die being mounted over said die receiving region in one of:

a first orientation wherein said first face is nearer said die receiving surface than is said second face, and wherein each of said bond pads is in electrical connection with one of said first contact sites that corresponds thereto; and a second orientation wherein said second face is nearer said die receiving surface than is said first face, and wherein each of said bond pads is in electrical connection with one of said second contact sites that corresponds thereto;

a plurality of electrically conductive traces, each electrically conductive trace corresponding to one of said first contact sites and one of said second contact sites and providing electrical connection therebetween, each electrically conductive trace further corresponding to one of said terminal contact sites and extending thereto inside of the semiconductor receiving member;

a mounting substrate on which said semiconductor die receiving member is mounted, said package mount edge being parallel to and juxtaposed said mounting substrate; and a plurality of contact pads on said mounting substrate in electrical connection with said terminal contact sites.

42. A semiconductor package assembly as recited in claim 41, wherein:

said first orientation further includes a conductive material interposed between each of said bond pads and said one of said first contact sites that corresponds thereto; and said second orientation further includes wiring extending between each of said bond pads and said one of said second contact sites that corresponds thereto.

43. A semiconductor package assembly as recited in claim 41, wherein said semiconductor die is a memory chip.

44. A semiconductor package assembly as recited in claim 41, wherein said die receiving surface is substantially orthogonal to a plane defined by said mounting substrate.

45. A semiconductor die receiving member comprising:

a dielectric material having thereon a die receiving surface and a package mount surface; and a plurality of electrically conductive traces electrically isolated within the dielectric material each terminating at a plurality of locations upon the die receive surface and at one location on the package mount surface.

46. The semiconductor die receiving member as defined in claim 45, wherein:

the die receiving surface electrical isolates each of said plurality of locations upon the die receive surface; and the package mount surface electrical isolates said one location upon the package mount surface.

47. The semiconductor die receiving member as defined in claim 45, wherein the die receiving surface is parallel to the package mount surface.

48. The semiconductor die receiving member as defined in claim 45, wherein the die receiving surface is perpendicular to the package mount surface.

49. A semiconductor package assembly comprising:

a dielectric material having a first surface on different plane than a second surface;

a plurality of electrically conductive traces electrically isolated within the dielectric material each terminating at a plurality of locations upon the first surface and at one location on the second surface;

a semiconductor die having a plurality of bond pads each contacting one location of said plurality of locations upon the first surface so as to leave exposed for each said trace the other of said plurality of locations upon the first surface; and a mounting substrate having thereon a plurality of electrically conductive connectors each being in electrically communication with:

an external electrical circuitry; and said one location on the second surface of each said trace.

\* \* \* \* \*

UNITED STATES PATENT AND TRADEMARK OFFICE
CERTIFICATE OF CORRECTION

PATENT NO. : 6,501,157 B1
DATED : December 31, 2002
INVENTOR(S) : Chad Cobbley

It is certified that error appears in the above-identified patent and that said Letters Patent is hereby corrected as shown below:

<u>Title page,</u>
After *Primary Examiner*, change "Yeusikov" to -- Yevsikov --

<u>Column 2,</u>
Line 33, change "embodiments," to -- embodiments --

<u>Column 7,</u>
Line 18, change "Reference" to -- reference --

<u>Column 9,</u>
Line 52, before "electrical" remove "an"

<u>Column 11,</u>
Line 42, after "connection" insert -- to --

<u>Column 15,</u>
Line 51, change "electrical" to -- electrically --

<u>Column 16,</u>
Line 61, change "electrically" to -- electrical --

Signed and Sealed this

Eighth Day of July, 2003

JAMES E. ROGAN
*Director of the United States Patent and Trademark Office*